United States Patent
Paik et al.

(10) Patent No.: US 9,880,205 B2
(45) Date of Patent: Jan. 30, 2018

(54) MINIMIZING BLIND SPOTS IN A SENSOR NETWORK

(71) Applicant: SCHNEIDER ELECTRIC IT CORPORATION, West Kingston, RI (US)

(72) Inventors: Namwook Paik, Acton, MA (US); Vishwas Mohaniraj Deokar, Acton, MA (US); James S. Spitaels, Shrewsbury, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 15 days.

(21) Appl. No.: 15/026,176

(22) PCT Filed: Oct. 7, 2013

(86) PCT No.: PCT/US2013/063677
§ 371 (c)(1),
(2) Date: Mar. 30, 2016

(87) PCT Pub. No.: WO2015/053740
PCT Pub. Date: Apr. 16, 2015

(65) Prior Publication Data
US 2016/0231360 A1 Aug. 11, 2016

(51) Int. Cl.
*G01R 15/18* (2006.01)
*G01R 19/25* (2006.01)
(Continued)

(52) U.S. Cl.
CPC .......... *G01R 15/183* (2013.01); *G01R 17/00* (2013.01); *G01R 19/2513* (2013.01);
(Continued)

(58) Field of Classification Search
None
See application file for complete search history.

(56) References Cited

U.S. PATENT DOCUMENTS

| | | | |
|---|---|---|---|
| 6,430,518 B1 * | 8/2002 | Roche | G01R 19/2513 340/663 |
| 6,507,184 B1 * | 1/2003 | Elston | G01R 19/2513 324/107 |

(Continued)

OTHER PUBLICATIONS

Notification of Transmittal of the International Search Report and the Written Opinion of the International Searching Authority from corresponding PCT/US2013/063677 dated Mar. 7, 2014.

*Primary Examiner* — Patrick Assouad
*Assistant Examiner* — Demetrius Pretlow
(74) *Attorney, Agent, or Firm* — Lando & Anastasi, LLP

(57) ABSTRACT

According to one aspect, embodiments herein provide a system for monitoring circuit branches coupled to an input line of a load center, the system comprising a plurality of first current sensors, each configured to be coupled to a circuit branch, at least one second current sensor configured to be coupled to the input line, a controller, a plurality of first sensor circuits, each configured, in a first mode of operation, to sample a signal from an associated current sensor, and in a second mode of operation, to be powered off, and at least one second sensor circuit configured to sample a signal from the at least one second current sensor and provide an input line current measurement signal to the controller, wherein the controller is configured to operate each first sensor circuit in one of the first and second modes of operation based on the input line current measurement signal.

20 Claims, 3 Drawing Sheets

(51) Int. Cl.
G01R 17/00 (2006.01)
H02J 13/00 (2006.01)
*G01R 21/133* (2006.01)

(52) U.S. Cl.
CPC ........ H02J 13/0062 (2013.01); *G01R 21/133* (2013.01); *Y02E 60/7838* (2013.01); *Y04S 40/124* (2013.01)

(56) References Cited

U.S. PATENT DOCUMENTS

| | | | |
|---|---|---|---|
| 6,968,277 B2 * | 11/2005 | Fletcher | H02H 1/0046 324/76.15 |
| 7,453,267 B2 * | 11/2008 | Westbrock, Jr. | H02H 1/0038 324/142 |
| 8,660,810 B2 | 2/2014 | Deokar et al. | |
| 8,666,685 B2 | 3/2014 | Paik et al. | |
| 9,146,259 B2 | 9/2015 | Blake et al. | |
| 9,267,826 B2 | 2/2016 | Paik et al. | |
| 2004/0183522 A1 * | 9/2004 | Gunn | G01R 15/185 324/126 |
| 2010/0308792 A1 | 12/2010 | Rupert et al. | |
| 2011/0291695 A1 * | 12/2011 | Teng | G01R 31/40 324/764.01 |
| 2012/0221278 A1 * | 8/2012 | Cook | G01R 21/133 702/107 |
| 2012/0268106 A1 | 10/2012 | Blake, Jr. et al. | |
| 2012/0271570 A1 | 10/2012 | Paik et al. | |
| 2012/0271579 A1 | 10/2012 | Deokar et al. | |
| 2013/0018609 A1 | 1/2013 | Filippenko et al. | |
| 2013/0229735 A1 * | 9/2013 | Rostron | H02H 3/083 361/44 |
| 2015/0102800 A1 | 4/2015 | Deokar et al. | |
| 2015/0102803 A1 | 4/2015 | Young et al. | |
| 2015/0331024 A1 | 11/2015 | Bruel et al. | |

* cited by examiner

MINIMIZING BLIND SPOTS IN A SENSOR NETWORK

CROSS-REFERENCE TO RELATED APPLICATIONS

This application is a U.S. National Stage Application under 35 U.S.C. § 371 of International Application No. PCT/US2013/063677, filed Oct. 7, 2013, titled MINIMIZING BLIND SPOTS IN A SENSOR NETWORK, which is hereby incorporated herein by reference in its entirety.

BACKGROUND OF INVENTION

Field of the Invention

At least one example in accordance with the present invention relates generally to distributed sensor networks in a load center.

Discussion of Related Art

A load center or panelboard is a component of an electrical supply system which divides an electrical power feed from a power line into different subsidiary circuit branches. Each subsidiary circuit branch may be connected to a different load. By dividing the electrical power feed into subsidiary circuit branches, the load center may allow a user to individually control and monitor the current, power and energy usage of each load.

A distributed network of current sensors within a load center is commonly used to monitor activity of the load center. For example, Current Transformers (CT) are typically used to monitor current, power and/or energy consumption in a subsidiary or main branch of a load center. A CT may be used to measure current in a branch by producing a reduced current signal, proportionate to the current in the branch, which may be further manipulated and measured. For example, a CT coupled to a branch of a load center may produce a reduced current AC signal, proportionate to the magnitude of AC current in the branch. The reduced current AC signal may then either be measured directly or converted to a DC signal and then measured. Based on the signal received, the level of current in the subsidiary branch may be determined Additionally, based on the level of current in the subsidiary branch, the power and/or energy provided to a load coupled to the subsidiary branch may also be determined.

SUMMARY OF THE INVENTION

Aspects in accord with the present invention are directed to a system for monitoring a plurality of circuit branches coupled to at least one input line of a load center, the system comprising a plurality of first current sensors, each configured to be coupled to one of the plurality of circuit branches and to produce a first reference signal having a level related to a current level of the one of the plurality of circuit branches, at least one second current sensor configured to be coupled to the at least one input line and to produce a second reference signal having a level related to a current level of the at least one input line, a controller, a plurality of first sensor circuits, each coupled to an associated one of the plurality of first current sensors and configured to be coupled to the controller, wherein each one of the plurality of first sensor circuits is further configured, in a first mode of operation, to sample the first reference signal from the associated one of the plurality of first current sensors, and in a second mode of operation, to be powered off, and at least one second sensor circuit coupled to the at least one second current sensor and configured to be coupled to the controller, wherein the at least one second sensor circuit is further configured to sample the second reference signal from the at least one second current sensor and provide, based on the sampling, an input line current measurement signal to the controller, wherein the controller is configured to operate each one of the plurality of first sensor circuits in one of the first mode of operation and the second mode of operation based on the input line current measurement signal received from the at least one second sensor circuit.

According to one embodiment, the controller is further configured to control the plurality of first sensor circuits to enter the second mode of operation in response to the input line current measurement signal received from the at least one second sensor circuit changing by less than a predetermined input line current threshold. In another embodiment, the controller is further configured to control at least one of the plurality of first sensor circuits to enter the first mode of operation in response to the input line current measurement signal received from the at least one second sensor circuit changing by more than the predetermined input line current threshold.

According to another embodiment, each one of the plurality of first sensor circuits is further configured, upon entering the first mode of operation, to compare a most recent sample of the first reference signal from its associated one of the plurality of first current sensors with a previously stored sample of the first reference signal. In one embodiment, each one of the plurality of first sensor circuits is further configured, in the first mode of operation, to transmit a circuit branch current update signal to the controller, based on the most recent sample of the first reference signal, in response to a determination that the most recent sample of the first reference signal is different than the previously stored sample of the first reference signal by more than a predetermined circuit branch current threshold.

According to one embodiment, each one of the plurality of first sensor circuits is further configured to enter the second mode of operation in response to a determination that the most recent sample of the first reference signal is different than the previously stored sample of the first reference signal by less than the predetermined circuit branch current threshold.

According to another embodiment, the system further comprises a communication bus, wherein each one of the plurality of first sensor circuits is further configured to be coupled to the controller via the communication bus, to convert the most recent sample of the first reference signal into a circuit branch digital reference signal, to generate the circuit branch current update signal based on the circuit branch digital reference signal, and to transmit the circuit branch current update signal to the controller, via the communication bus. In one embodiment, each one of the plurality of second sensor circuits is further configured to be coupled to the controller via the communication bus, to convert samples of the second reference signal into input line digital reference signals, to generate input line current measurement signals based on the input line digital reference signals, and to transmit the input line current measurement signals to the controller via the communication bus.

According to one embodiment, the system further comprises a voltage module configured to be coupled to the at least one input line and the controller, wherein the voltage module is further configured to receive power from the at least one input line, to measure at least one of the voltage, phase, and frequency of the received power, and to transmit information related to the at least one of the measured voltage, phase, and frequency to the controller. In one embodiment, the controller is further configured to transmit the information related to at least one of the measured voltage, phase, and frequency of the received power to at least one of the plurality of first sensor circuits, and the at least one of the plurality of first sensor circuits is further configured to calculate a power parameter of the one of the plurality of circuit branches based on the sampled first reference signal and the received information related to at least one of the measured voltage, phase, frequency.

According to another embodiment, the controller is further configured to transmit the information related to at least one of the measured voltage, phase, and frequency of the received power to the at least one of the plurality of first sensor circuits in response to a determination that the information related to at least one of the measured voltage, phase, and frequency received from the PVM has changed by more than a predefined threshold. In one embodiment, the controller is further configured to transmit the information related to at least one of the measured voltage, phase, and frequency of the received power to the at least one of the plurality of first sensor circuits in response to a determination that at least one of the voltage and frequency of the received power has changed by more than the predefined threshold.

Another aspect in accord with the present invention is directed to a method for monitoring a plurality of circuit branches coupled to at least one input line of a load center, the method comprising coupling a first current sensor to each one of the plurality of circuit branches, coupling at least one second current sensor to the at least one input line, coupling a plurality of first sensor circuits to a controller, wherein each of the first sensor circuits is coupled to one of the first current sensors, coupling at least one second sensor circuit to the controller, wherein the at least one second sensor circuit is coupled to the at least one second current sensor, generating, in each first current sensor, a first reference signal having a level related to a current level of one of the plurality of circuit branches, generating, in the at least one second current sensor, a second reference signal having a level related to a current level of the at least one input line, sampling, with each one of the plurality of first sensor circuits in a first mode of operation, the first reference signal from the associated first current sensor, maintaining, in a second mode of operation of the plurality of first sensor circuits, each one of the plurality of first sensor circuits in an off state, controlling each one of the plurality of first sensor circuits to operate in one of the first mode of operation and the second mode of operation based on the second reference signal.

According to one embodiment, the method further comprises sampling, with the at least one second sensor circuit, the second reference signal from the at least one second current sensor, providing, based on the sampling of the second reference signal, an input line current measurement signal from the at least one sensor circuit to the controller, and controlling each one of the plurality of first sensor circuits to operate in one of the first mode of operation and the second mode operation based on the input line current measurement signal from the at least one second sensor circuit.

According to another embodiment, the method further comprises determining, based on the input line current measurement signal, whether the current level of the at least one input line has changed by more than a predetermined input line current threshold, controlling each one of the plurality of first sensor circuits to operate in one of the first mode of operation and the second mode of operation includes controlling each one of the plurality of first sensor circuits to enter the second mode of operation in response to a determination that the current level of the at least one input line has changed by less than a predetermined input line current threshold, and controlling each one of the plurality of first sensor circuits to operate in one of the first mode of operation and the second mode of operation further includes controlling at least one of the plurality of first sensor circuits to enter the first mode of operation in response to a determination that the current level of the at least one input line has changed by more than a predetermined input line current threshold.

According to one embodiment, the method further comprises comparing, with each one of the plurality of first sensor circuits upon entering the first mode of operation, a most recent sample of the first reference signal from its associated first current sensor with a previously stored sample of the first reference signal, transmitting, with each one of the plurality of first sensor circuits, a circuit branch current update signal to the controller, based on the most recent sample of the first reference signal, in response to the most recent sample of the first reference signal being different than the previously stored sample of the first reference signal by more than a predetermined circuit branch current threshold, and controlling each one of the plurality of first sensor circuits to enter the second mode of operation in response to the most recent sample of the first reference signal being different than the previously stored sample of the first reference signal by less than the predetermined circuit branch current threshold.

According to another embodiment, the method further comprises updating, with each one of the plurality of first sensor circuits upon transitioning from the first mode of operation to the second mode of operation, a value of the previously stored sample of the first reference signal to a value of the most recent sample of the first reference signal.

According to one embodiment, sampling, with each one of the plurality of first sensor circuits in the first mode of operation, the first reference signal from the associated first current sensor includes sampling the first reference signal at least one of a predefined sample rate and for a predetermined period of time, and wherein the method further comprises adjusting at least one of the predefined sample rate and the predetermined period of time in response to a stability determination of the current level of an associated circuit branch.

According to another embodiment, the method further comprises measuring at least one of voltage, phase and frequency of power provided to the plurality of circuit branches, determining if data related to at least one of the measured voltage, phase and frequency has changed by more than an input power threshold, in response to a determination that the data related to at least one of the measured voltage, phase and frequency has changed by more than an input power threshold, transmitting the data related to the at least one of the voltage, the phase and the frequency to the plurality of first sensor circuits, and calculating, with at least one of the plurality of first sensor circuits, a power parameter of one of the plurality of circuit branches based on the received data related to the at least one of the voltage, the phase and the frequency.

One aspect in accord with the present invention is directed to a system for monitoring a plurality of circuit branches coupled to at least one input line of a load center, the system comprising a plurality of current sensors, each configured to be coupled to at least one of the plurality of circuit branches and to produce a signal having a level related to a current level of the one of the plurality of circuit branches, a controller, a plurality of sensor circuits, each coupled to an associated one of the plurality of current sensors and configured to be coupled to the controller, wherein each one of the plurality of sensor circuits is configured to convert the signal from the associated one of the plurality of current sensors to a reference signal and provide the reference signal to the controller, and means for monitoring a current level of the at least one input line and maintaining the plurality of sensor circuits in a sleep state until a change in the current level of the at least one input line is sensed that may impact power and energy measurement accuracy of the plurality of sensor circuits.

BRIEF DESCRIPTION OF DRAWINGS

The accompanying drawings are not intended to be drawn to scale. In the drawings, each identical or nearly identical component that is illustrated in various FIGs. is represented by a like numeral. For purposes of clarity, not every component may be labeled in every drawing. In the drawings.

DETAILED DESCRIPTION

Figure 1:
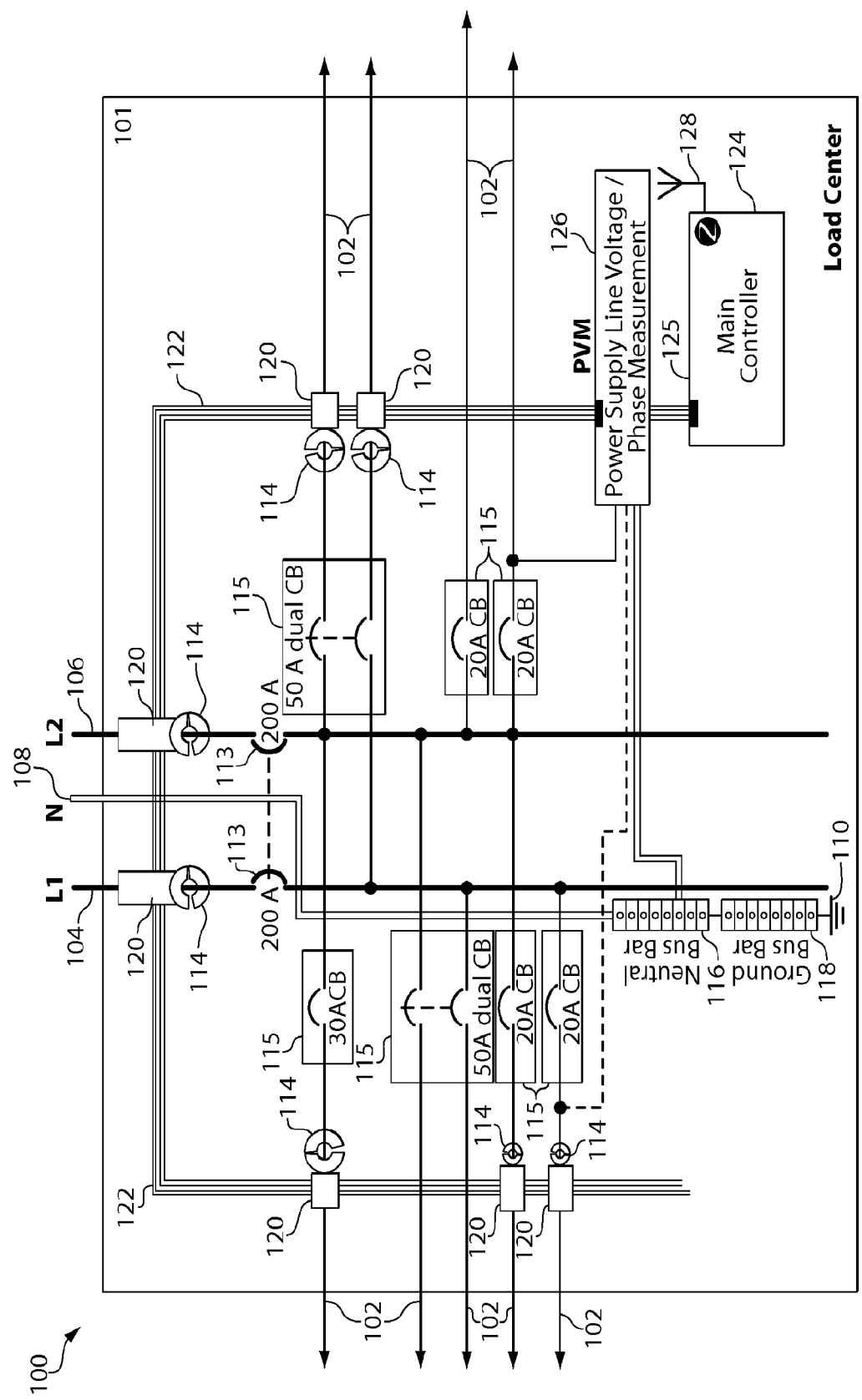
FIG. 1 is a circuit diagram of a load center in accordance with aspects of the present invention.

Embodiments of the invention are not limited to the details of construction and the arrangement of components set forth in the following description or illustrated in the drawings. Embodiments of the invention are capable of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

As discussed above, a distributed sensor network may be utilized to monitor circuit branches of a load center and assist in providing efficient energy management. For instance, sensors or meters may be coupled to circuit branches, inside or outside of a load center, to monitor current, power and/or energy consumption in the circuit branches.

In one example, such sensors or meters include dedicated hardware (e.g., analog Integrated Circuits (IC) or custom Application Specific Integrated Circuits (ASIC)). The dedicated hardware typically includes specific high performance components that are configured to continuously sample current and/or voltage of a circuit branch at a high rate. In such high performance sensors, a relatively small amount of the voltage or current waveform on a circuit branch is ignored (i.e., the sensor has relatively few "blind spots"), making the resulting measurements very accurate. However, due to the high rate of measurement of the sensor and the amount of information being handled by the sensor, the resource requirements (e.g., processing, bandwidth, and latency requirements) of the sensor may be relatively high. In addition, due to the type of high performance components within the sensor, the cost of the sensor may also be relatively high. Such high resource and high cost sensors may be impractical for use in relatively modest, low cost implementations such as in Uninterruptible Power Supplies (UPS).

In other examples, where relatively high system resources (e.g., high bandwidth, low latency, or high processing requirements) and/or high performance components are not available or practical (e.g., due to cost constraints or system architecture limitations), sensors or meters coupled to circuit branches of a load center may include general purpose components that are programmed and configured to introduce "blind spots" while monitoring the circuit branches. "Blind spots" are periods of time when part or all of the pertinent information (e.g., voltage, current, frequency, phase) is not measured (or discarded). By ignoring portions of the voltage and/or current waveforms on a circuit branch to fit the measured information within the available bandwidth or computing resources of a sensor, the "blind spots" may help the sensor to reduce power consumption, limit internal communication bandwidth requirements, and limit required computing resources. While the introduction of "blind spots" to a sensor limits the complexity and/or cost of the sensor, it also may compromise the accuracy of measurements made by the sensor and lead to potential inaccuracies in power and energy measurements.

Embodiments described herein provide an accurate energy measurement system that minimizes the impact of measurement blind spots. According to at least one embodiment, the energy measurement system described herein is a flexible and adaptable system where different measurement nodes can be tailored with varying levels of "blindness" based on actual conditions or load characteristics. By adjusting the system based on actual conditions, the energy measurement system described herein utilizes the available hardware resources more efficiently and allows relatively low cost hardware to perform almost as well as, or in some cases as well as, high-end metering solutions.

FIG. 1 shows a load center 100 that includes a system for monitoring subsidiary circuit branches 102 of the load center 100 according to one embodiment of the current invention. The load center 100 includes a housing 101. Within the housing 101, the load center 100 includes a first input power line 104, a second input power line 106, a plurality of circuit branches 102, a neutral line 108, and a ground connection 110. The first and second input power lines 104, 106 and the neutral line 108 are each configured to be coupled to an external power source (e.g., a utility power system). Each one of the plurality of circuit branches 102 is configured to be coupled to one of the input power lines 104, 106 and the neutral line 108. Each one of the plurality of circuit branches 102 is also configured to be coupled to an external load (e.g., an appliance, a power outlet, a light etc.).

According to one embodiment, each one of the input power lines 104, 106 includes a circuit breaker 113 coupled between the input power line 104, 106 and circuit branches 102. According to another embodiment, each one of the plurality of circuit branches 102 includes a circuit breaker 115 coupled between the input power line 104, 106 and an external load 112. In one embodiment, the current rating of each of the circuit breakers 113, 115 may be configured based on the power required by the external load 112 to which the circuit breakers 113, 115 associated circuit branch 102 is coupled. The neutral line 108 is coupled to the ground connection 110. According to one embodiment, the neutral line is coupled to the ground connection 110 via a neutral bus bar 116. According to another embodiment, the ground connection 110 is coupled to the neutral line 108 via a ground bus bar 118.

Within the housing 101, the load center 100 also includes a plurality of Current Transformers (CT) 114, a plurality of smart sensor circuits 120, a communication bus 122, a Power/Voltage Module (PVM) 126, and a main controller 124. According to one embodiment, the communication bus 122 includes a plurality of wires. For example, in one embodiment, the communication bus 122 is a ribbon cable including 4 wires (a power line, a return line, D+ differential pair line, D− differential pair line); however, in other embodiments, the communication bus 122 may include any number and type of wires. Each one of the plurality of CT's 114 is coupled to at least one of the plurality of circuit branches 102. According to one embodiment, CT's 114 may also be coupled to each input line 104, 106. According to one embodiment, each CT 114 encompasses a corresponding circuit branch 102 or input line 104, 106. Each one of the plurality of CT's is also coupled to a corresponding smart sensor circuit 120. Each smart sensor circuit 120 is coupled to the communication bus 122.

According to one embodiment, each smart sensor circuit 120 is connected to the communication bus 122 so that the smart sensor circuit 120 is in electrical communication with the main controller 124. In one embodiment, each smart sensor circuit 120 is clamped onto the communication bus 122. For example, in one embodiment, electrical contacts of a smart sensor circuit 120 are pressed onto the communication bus 122 so that the electrical contacts pierce an insulation layer of the communication bus 122 and become electrically coupled to appropriate conductors within the communication bus 122. In other embodiments, the smart sensor circuits 120 may be coupled differently to the communication bus 122. For example, according to one embodiment, the smart sensor circuits 120 may be coupled to the communication bus 122 via a bus bar or daisy chained connectors. According to some embodiments, each smart sensor circuit 120 is connected to the communication bus 122 as described in U.S. Patent Application Publication No. US 2012/0268106, entitled "Smart Current Transformers," published Oct. 25, 2012, which is hereby incorporated herein by reference in its entirety.

According to one embodiment, the main controller 124 includes a digital interface 125 and a Zigbee RF interface 128. The communication bus 122 is coupled to the digital interface 125. According to one embodiment, the PVM 126 is coupled to at least one input power line 104, 106 via at least one branch circuit 102. According to one embodiment, the main controller 124 includes at least one analog interface which is configured to be coupled directly to one of the smart sensor circuits.

According to one embodiment, AC power is provided from an external source (e.g., a utility power system) to the input lines 104, 106. AC power from the input lines 104, 106 is provided to each of the external loads via the circuit branches 102. The circuit breakers 113 are configured to automatically open and prevent current in an input line 104, 106 if an overload or short circuit is detected in the input line 104, 106. The circuit breakers 115 are configured to automatically open and prevent current in a circuit branch 102 if an overload or short circuit is detected in the circuit branch 102.

The PVM 126 receives AC power from at least one input line 104, 106 and acts as a power source for the main controller 124. According to one embodiment, the PVM 126 may also act as a power source for other components within the housing 101 (e.g., the smart sensor circuits 120). In addition, the PVM 126 measures the AC voltage, frequency and/or phase of the AC power and communicates the measured AC voltage, frequency, and/or phase information to the main controller 124.

According to one embodiment, the main controller 124 is configured to communicate the measured AC voltage, frequency and/or phase information to the smart sensor circuits 120, via the communication bus 122. For example, in one embodiment, the main controller 124 transmits phase information of the AC power to the smart sensor circuits 120 so that the main controller 124 may be synchronized with the smart sensor circuits 120. According to one embodiment, the main controller 124 is synchronized with the smart sensor circuits 120 as described in U.S. Patent Application Publication No. US 2012/0271579, entitled "System and Method to Calculate RMS Current and True Power in a Multidrop Sensor Network," published Oct. 25, 2012, which is hereby incorporated herein by reference in its entirety. According to one embodiment, the main controller 124 is also capable of being powered by a battery.

AC current passing through a circuit branch 102 or input line 104, 106 induces a proportionate AC current in its associated CT 114 which encompasses the circuit branch 102 or input line 104, 106. According to one embodiment, where a CT 114 may be coupled to multiple circuit branches 102, an AC current proportionate to the combined current in the multiple circuit branches is induced in the CT 114 which encompasses the multiple circuit branches.

According to one embodiment, the smart sensor circuit 120 coupled to the CT 114 converts the proportionate AC current from the CT 114 into a digital value and then transmits the digital value as a digital measurement signal, over the communications bus 122, to the main controller 124. According to another embodiment, the smart sensor circuit 120 transmits an analog measurement signal, related to the proportionate AC current from the CT 114, directly to an analog interface of the main controller 124.

In addition, the smart sensor circuit 120 may be configured to utilize the voltage, frequency and/or phase information received from the main controller 124 over the communications bus 122 (or direct connection). For example, in one embodiment, the smart sensor circuit 120 utilizes the phase information received from the main controller 124 to synchronize operation with the main controller 124 such that current measurements performed by the smart sensor circuits 120 can by synchronized with voltage measurements made by the main controller 124.

In another example, the smart sensor circuit 120 utilizes the received voltage, frequency and/or phase information to calculate power and energy parameters such as RMS current, true and apparent power, and power factor of the circuit branch 102 or input line 104, 106. According to one embodiment, this information may also be converted into digital values and sent to the digital interface 125 of the main controller 124 over the communications bus 122. In another embodiment, this information may be transmitted directly to the main controller 124.

According to one embodiment, upon receiving the current information from the smart sensor circuits 120, the main controller 124 utilizes the measured voltage, frequency and/or phase information to calculate power and energy parameters such as RMS current, true and apparent power, and power factor of the circuit branch 102 or input line 104, 106.

According to one embodiment, upon receiving the current information and receiving and/or calculating the power information, the main controller 124 transmits the current, power and energy information to an external client (e.g., a web server, in-home display, internet gateway etc.) via the wireless Zigbee RF interface 128 to assist in power management of the load center 100 and to assist in power management and control of a residence or other facility containing the system. The main controller 124 may also transmit the current, power and energy information to an external client via a wired connection or any type of wireless connection.

The system described above in relation to FIG. 1 may be configured to continuously measure and store all voltage and current waveforms on the circuit branches, and hence be capable of computing power and energy of the circuit branches without any blind spots. However, due to limitations in the components used in the system (e.g., limitations on power consumption, computer power, computing resources, communications bandwidth, etc.), providing power and energy measurements without blind spots may be impractical or too costly.

According to one embodiment, the system is configured to introduce "blind spots" in the monitoring of the circuit branches 102 by the sensor circuits 120. According to one embodiment, the system is further configured to adjust the "blind sports" of the sensor circuits 120 based on actual conditions of the load panel 100, to optimize and balance the available bandwidth, computing resources and power consumption of the main controller 124 and sensor circuits 120 while also providing accurate power and energy measurements.

According to one embodiment, the main controller 124 monitors current on the input lines 104, 106 by receiving current information, via the communications bus 122, from the sensor circuits 120 coupled to the input lines 104, 106. Based on the current information received from the smart sensor circuits 120 coupled to the input lines 104, 106, the main controller 124 actively manages the operational state of the other smart sensor circuits 120 coupled to circuit branches 102.

For example, according to one embodiment, the main controller 124 operates the sensor circuits 120 coupled to the input lines 104, 106 to remain on and continuously measuring the current in the input lines 104, 106 (i.e., with no "blind spots"). The main controller 124 also operates the sensor circuits 120 coupled to the circuit branches 102 to generally remain off, in a "sleep" state, or in a standby/low power mode (e.g., for 599 cycles out of 600 cycles). According to one embodiment, prior to going to "sleep", each sensor circuit 120 coupled to a circuit branch 102 stores in memory (e.g., within the sensor circuit 120 or main controller 124) the most recent sensed current information from the associated branch.

If the main controller 124 identifies that the current in an input line 104, 106, sensed by the sensor circuits 120 coupled to the input lines 104, 106 and provided to the main controller 124, has changed by more than an input current predefined threshold (e.g., by more than five percent over ten cycles), the main controller 124 transmits a signal, via the communications bus 122, to each sensor circuit 120 coupled to a circuit branch 102 instructing the sensor circuit 120 to wake up and measure the current in its associated circuit branch 102. According to one embodiment, each sensor circuit 120 is instructed to wake up simultaneously and measure the current in its associated circuit branch. According to another embodiment, one sensor circuit 120 at a time is instructed to wake up and measure the current in its associated circuit branch 102.

Upon waking up, each sensor circuit 120 compares it's most recent current measurement of its associated circuit branch 102 with the current measurement previously stored in memory prior to the sensor circuit 120 last entering a "sleep" state. If a sensor circuit 120 detects a change between the most recent current sample and the previously stored current sample of more than a predefined circuit branch threshold (e.g., more than ten percent), the sensor circuit 120 will remain on, continue to measure the current in the associated circuit branch 102, and transmit updated current information to the main controller 124, until the current in the associated circuit branch stabilizes (i.e., the current in the associated circuit branch is not changing more than the predefined threshold over a predefined period of time (e.g., 600 cycles)). Once the current in the associated branch 102 stabilizes, the most recent current measurement is again stored in memory and the sensor circuit 120 turns off. If, upon waking up, a sensor circuit 120 detects no, or little (e.g., less than ten percent), change compared to the previously stored current measurement, the sensor circuit 120 is turned off.

By adjusting the "blindness" of a sensor circuit 120 (as described above), a change in power being provided to a load that occurs during a period of time when a corresponding sensor circuit 120 is off, will not affect the accuracy of the energy measurement of the circuit branch 102 by more than an amount that is dependent on the input current predefined threshold that triggers the sensor circuit 120 to wake up, the circuit branch predefined threshold that triggers the sensor circuit 120 to transmit updated current measurement information to the main controller 124, and any potential time delays. According to one embodiment, the system can be configured with varying levels of sensitivity and delays (i.e., thresholds), to increase or decrease the amount of power and energy measurement error the user is willing to accept. Accordingly, a user of the system may balance the need to limit required system resources with the desire to have accurate power and energy measurements.

Figure 2:
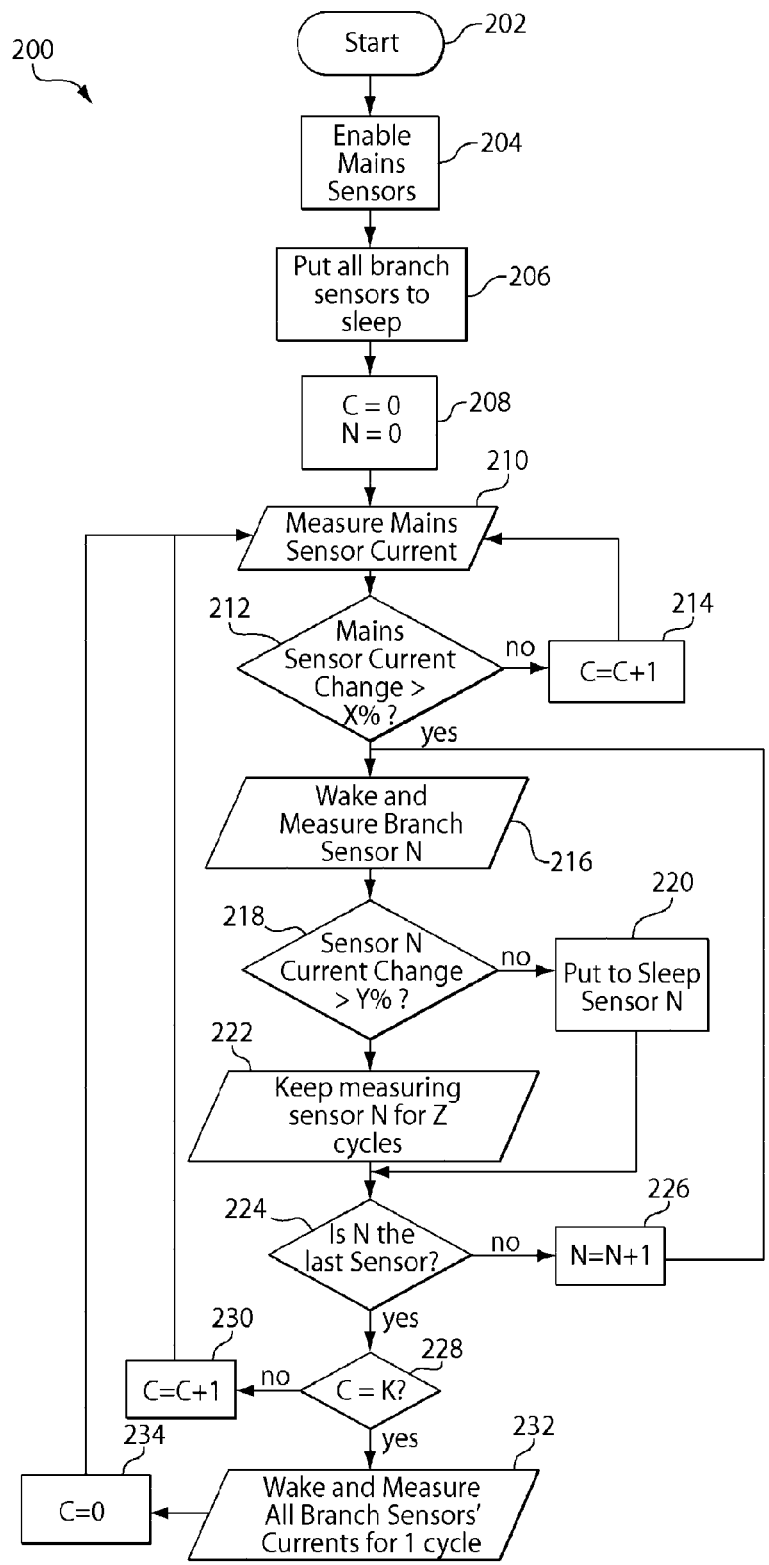
FIG. 2 is a flow chart of a method of operation of a distributed sensor network in accordance with aspects of the present invention.

Operation of the system described above with regard to FIG. 1 is discussed in greater detail below with regard to FIG. 2. FIG. 2 is a flow chart 200 of a method of operation of a distributed sensor network (e.g., the sensor network within the load center 100) in accordance with aspects of the present invention.

At block 202, the sensor network is activated. At block 204, the main controller 124 enables the sensor circuits 120 coupled to the input lines 104, 106. As discussed above, according to one embodiment, the sensor circuits 120 coupled to the input lines 104, 106 are enabled to continuously monitor the current in the input lines 104, 106 without "blind spots" and provide continuous current information to the main controller 124 via the communications bus 122.

At block 206, the main controller 124 puts each sensor circuit 120 coupled to a circuit branch 102 to sleep (i.e., turns off each sensor circuit 120). As discussed above, prior to going to "sleep", each sensor circuit 120 stores in memory the most recent sampled current information from its associated branch 102. At block 208, the variable C (an AC line cycle counter) and the variable N (the current sensor 120 ID) are set to zero.

At block 210, the main controller 124 receives, via the communications bus 122, input line 104, 106 current information from the sensor circuits 120 coupled to the input lines 104, 106. As discussed above, the main controller 124 receives continuous input current information from the sensor circuits 120 coupled to the input lines 104, 106. At block 212, the main controller 124 determines if the current in an input line 104, 106 has changed by more than a predetermined input current threshold percentage (X). According to one embodiment, X is five percent; however, in other embodiments, X may be defined as any desired percentage.

At block 214, in response to a determination that the current in an input line 104, 106 has not changed by more than the predetermined input current threshold, the variable C is incremented and the main controller 124, at block 210, continues to monitor the input current of the input lines 104, 106 for a change that will trigger the wakeup of the sensor circuits 120 coupled to the circuit branches 102.

At block 216, in response to a determination that the current in the input line 104, 106 has changed by more than the predetermined input current threshold, the main controller 124 transmits a wakeup signal, via the communications bus 122, to the sensor circuit 120 having an identifier (N) of zero. At block 218, the sensor circuit 120 having the identifier (N) of zero is turned on and begins to measure the current in its associated circuit branch 102. The sensor circuit 120 compares the most recent circuit branch current measurement with the current measurement previously stored in memory prior to the sensor 120 last entering a "sleep" state and determines if the circuit branch current has changed by more than a predetermined circuit branch threshold percentage (Y). According to one embodiment, the circuit branch threshold percentage equals ten percent; however, in other embodiments, the circuit branch threshold may be defined as any other desired percentage.

At block 220, in response to a determination that the circuit branch current has not changed by more than the predetermined circuit branch threshold, the sensor circuit 120 having the identifier (N) of zero goes back to sleep. At block 222, in response to a determination that the circuit branch current has changed by more than the predetermined circuit branch threshold, the sensor circuit 120 having the identifier (N) of zero continues to measure the current in its associated circuit branch 102 for a period of Z cycles and to update the current measurements sent to the main controller 124. After Z cycles, the sensor circuit 120 stores in memory the most recent sensed current information from the associated branch 102 and goes back to sleep. According to one embodiment, if after Z cycles, the current in the associated branch 102 remains unstable, the sensor circuit 120 will continue to measure the current in the circuit branch 102 until it stabilizes. According to one embodiment, Z equals ten cycles; however, in other embodiments, the variable Z may be defined as any number of cycles.

According to one embodiment, the variable Z is fixed. However, in other embodiments, the variable Z is adjustable. According to one embodiment, the variable Z may be adjusted by a sensor circuit 120 in response to recent current samples of the sensor circuits 120 associated current branch 102. For instance, according to one embodiment, where the recent current measurements made by the sensor circuit 120 indicate that the current in the circuit branch 102 is stable (i.e., is not changing by more than one percent), the sensor circuit 120 may determine that the full number of current samples (Z) is not required or that sampling may stop altogether. In response the sensor circuit 120 may reduce the variable Z, take less samples, turn off and stop measuring current in the circuit branch 102, and/or simply inform the main controller 124 that there are no further current updates to be made regarding the circuit branch 102.

For example, where a circuit branch 120 is coupled to an incandescent lamp, when the lamp is turned on, the initial step change in current provided to the lamp is detected by the main controller 124 which triggers the corresponding sensor circuit 120 to turn on. However, once the filament within the lamp has reached a stable temperature, the current to the lamp via the circuit branch 102 is very stable. While monitoring current on the circuit branch 102, the sensor circuit 120 may identify that the current is stable (e.g., not changing by more than one percent) and as a result, may recognize that it is not necessary to measure the stable current in the circuit branch 102 continuously. As a result, the sensor circuit 120 may reduce the number of times it samples the current in the circuit branch 102 per cycle, reduce the number of cycles in which samples of the current in the circuit branch 102 are taken, turn off, and/or inform the main controller 124 that there will no further current updates regarding the associate circuit branch 102.

According to one embodiment, where the sensor circuit 120 identifies that the current in its associated current branch 102 is stable and does not necessarily need to be measured continuously, the sensor circuit 120 may continue to make the full number of current measurements but may only transmit a portion of the current measurements to the main controller 124. For example, the sensor circuit 120 may only transmit current measurements to the main controller 124 that indicate a change in current by more than a predetermined threshold.

In another embodiment, where the sensor circuit 120 is performing power and/or energy calculations of its circuit branch 102 and identifies that the current in its associated current branch 102 is stable, the sensor circuit 120 may avoid performing full true power calculations and may instead, perform a more simple power calculation (e.g., RMS voltage×RMS current×power factor).

In another embodiment, where the sensor circuit 120 identifies that the current in its associated current branch 102 is stable, the sensor circuit 120 may reduce the number of bits used in transmitting information to the main controller 124 via the communications bus 122. For example, according to one embodiment, the sensor circuit 120 reduces the information transmitted to the main controller 124 from twenty-four bits/sample to eight bits/sample. In another embodiment, the sensor circuit 120 may reduce the information transmitted to the main controller 124 to a single bit (e.g., indicating whether a load coupled to the circuit branch 102 is on or off or indicating whether a load coupled to the circuit branch 102 has experienced a change of power—e.g., at least 50 W).

According to another embodiment, where the recent current measurements made by the sensor circuit 120 indicate that the current in the circuit branch 102 is unstable (i.e., the current measurements are very dynamic or erratic), the sensor circuit 120 may determine that more current samples (then were originally planned) should be taken of the circuit branch 102. In response the sensor circuit 120 may increase the variable Z, increase the number of samples, prevent itself from turning off, transmit current measurements to the main controller 124 more frequently, and/or perform more frequent power and energy calculations.

For example, where a circuit branch 120 is coupled to a clothes dryer, the clothes dryer may have an erratic current profile that is not easily characterized or predicted. While monitoring current on the circuit branch 102 coupled to the clothes dryer, the sensor circuit 120 may identify that the current is unstable and as a result, may recognize that it necessary to increase the current measurements being made of the circuit branch 102. As a result, the sensor circuit 120 may increase the number of times it samples the current in the circuit branch 102 per cycle, increase the number of cycles in which the current is sampled, prevent itself from turning off, transmit current measurements of the circuit branch 102 to the main controller 124 more frequently, and/or perform more frequent power and energy calculations.

According to one embodiment where the sensor circuit 120 identifies that the current in its associated branch is unstable and, as a result, prevents itself from turning off (i.e., continues to measure current in its associated branch and transmit updates to the main controller 124), the sensor circuits 120 coupled to the input lines 104, 106 may also be controlled to ignore corresponding current changes in the input lines 104, 106. By ignoring the corresponding current changes in the input lines 104, 106 due to the known unstable current in a circuit branch 102, other sensor circuits 120 may not be unnecessarily woken up in response to the known unstable current.

As discussed above, modification to parameters of the current measurements being made of a circuit branch 102 may be controlled by the sensor circuit 120 coupled to the circuit branch 102 in response to the sensor circuit 120 identifying a relatively stable or unstable current in the circuit branch 102; however, in other embodiments, modification to parameters of the current measurements being made of a circuit branch 102 may also be controlled by the main controller in response to current samples received from the smart sensor circuit 120 coupled to the circuit branch 102.

According to one embodiment, as the sensor circuit 120 having the identifier (N) of zero monitors the stability of current in its associated circuit branch 102, the main controller 124 continues to receive continuous input current information from the sensor circuits 120 coupled to the input lines 104, 106.

At block 224, after the sensor circuit 120 having the identifier (N) of zero goes to sleep, the main controller 124 determines if there are more sensors in the network that need to be checked for current stability. At block 226, in response to a determination that the sensor circuit 120 having the identifier (N) of zero was not the last sensor to be checked, the variable N is incremented (e.g., to N equals one). At block 216, the main controller 124 transmits a wakeup signal, via the communications bus 122, to the sensor circuit 120 having an identifier (N) of one. The current in the circuit branch 102 associated with the sensor circuit 120 having the identifier (N) of one is then monitored for stability and the current information provided to the main controller 124 is either confirmed or updated, as discussed above with regard to blocks 218-224. This process continues until each current sensor 120 in the system has been awakened and its current either confirmed or updated. According to one embodiment, the measured change in input current that triggered the awakening of the sensor circuits 120 is due to a change in current in a single circuit branch 102. According to another embodiment, the measured change in input current that triggered the awakening of the sensor circuits 120 may be due to current changes in more than one circuit branch 102.

At block 228, in response to a determination that all sensors 120 in the system have been checked for current stability, the main controller 124 determines if the variable C equals a predetermined maximum number of cycles (K) which are allowed to pass before each sensor circuit 120 in the system should be polled. In response to a determination that the variable C does not equal the variable K, at block 230, the variable C is incremented, at block 210, the main controller 124 continues to receive continuous input current information from the sensor circuits 120 coupled to the input lines 104, 106, and at block 212, the main controller 124 determines if the current in an input line 104, 106 has changed more than a predetermined input current threshold to trigger the awakening of the sensor circuits 120.

At block 232, in response to a determination that the variable C equals the variable K, each one of the sensor circuits 120 is awakened, the current in each associated circuit branch is measured for D cycles, and current information provided to the main controller 124 is updated. According to one embodiment, the variable D equals one cycle; however, in other embodiments, the variable D may be defined as any number of cycles. In this way, each sensor circuit will at least be polled for stability when C equals K. According to one embodiment, the variable C is incremented by one each line cycle. In another embodiment, the variable C is incremented by one every ten line cycles. In other embodiments, the variable C may be configured to be incremented at any desired number of line cycles. A reduction in how often variable C is incremented may result in lower power and/or bandwidth system requirements; however, it may also lower power and energy measurement accuracy of the system.

At block 234, each sensor circuit 120 goes back to sleep and the variable C is reset to zero. At block 210, the main controller 124 continues to receive continuous input current information from the sensor circuits 120 coupled to the input lines 104, 106, and at block 212, the main controller 124 determines if the current in an input line 104, 106 has changed more than a predetermined input current threshold to trigger the awakening of the sensor circuits 120.

By only turning on the sensor circuits 120 when input line current is unstable (i.e., has changed more than a predefined input current threshold) and only updating circuit branch 102 current information provided to the main controller 124 when circuit branch 102 current is unstable (i.e., has changed more than a predefined circuit branch threshold), the required resources (e.g., bandwidth, processing power, power consumption etc.) required by the system may be minimized while still maintaining accurate power and energy measurements.

As discussed above, the main controller 124 is configured to wake-up sensor circuits 120 in response to identifying an unstable current on an input line 104, 106. According to one embodiment, the main controller 124 may also control internal traffic between the main controller 124 and the sensor circuits 120 based on other identified changes in signals received from the input lines 104, 106.

For example, as discussed above, the main controller 124 receives measured AC voltage, frequency, and/or phase information from the PVM 126. The main controller 124 may provide this AC voltage, frequency, and/or phase information to the sensor circuits 120 via the communications bus. According to one embodiment, to avoid saturating the communications bus 122, the main controller 124 does not continuously stream the AC voltage, frequency, and/or phase information to the sensor circuits 120, but instead, only sends AC voltage, frequency, and/or phase information updates to the sensor circuits 120 when a change above a predefined threshold is identified in the AC voltage, frequency, and/or phase information received from the PVM 126 (which is indicative of AC voltage, frequency, and/or phase of signals received on the input lines 104, 106).

For example, according to one embodiment, the main controller 124 transmits AC voltage, frequency, and/or phase information updates to the sensor circuits 120 when a change in calculated RMS voltage on an input line 104, 106 (based on the information received from the PVM 126) is above a predefined threshold percentage. According to one embodiment, the main controller 124 transmits AC voltage, frequency, and/or phase information updates to the sensor circuits 120 when the RMS voltage on the input line 104, 106 changes by more than five percent for at least five line cycles. In another embodiment, the main controller 124 transmits AC voltage, frequency, and/or phase information to the sensor circuits 120 when the RMS voltage on the input line 104, 106 changes by more than two percent for at least sixty line cycles. In other embodiments, the change in RMS voltage that triggers the main controller 124 to transmit updates to the sensor circuits 120 may be defined as any desired percentage.

According to another embodiment, the main controller 124 transmits AC voltage, frequency, and/or phase information updates to the sensor circuits 120 when a change in instantaneous voltage on an input line 104, 106 (received from the PVM 126) is above a predefined threshold (i.e., it spikes or dips). According to one embodiment, the main controller 124 transmits AC voltage, frequency, and/or phase information updates to the sensor circuits 120 when the instantaneous voltage on an input line 104, 106 has measured more than ten percent above an expected value for at least three consecutive samples. In other embodiments, the change in instantaneous voltage that triggers the main controller 124 to transmit updates to the sensor circuits 120 may be defined as any desired percentage over any number of samples.

According to another embodiment, the main controller 124 transmits AC voltage, frequency, and/or phase information updates to the sensor circuits 120 when a change in the frequency of signals received on an input line 104, 106 is more than a predetermined threshold. According to one embodiment, the main controller 124 transmits AC voltage, frequency, and/or phase information updates to the sensor circuits 120 when the frequency of signals received on an input line 104, 106 changes by more than 0.01 Hz/s. In other embodiments, the frequency change that triggers the main controller 124 to transmit updates to the sensor circuits 120 may be defined as any desired frequency change.

As discussed above, the PVM provides AC voltage information to the main controller 124 and in some embodiments, the main controller 124 provides the AC voltage information to the sensor circuits 120. In other embodiments, the sensor circuits 120 may include circuitry to directly measure voltage provided to its associated circuit branch 102.

According to one embodiment, upon startup of the system, each sensor circuit 120 enters a "high-performance" mode in which the sensors 120 are configured to measure the associated circuit branches 102 continuously (i.e., without blind spots). According to one embodiment, the sensor circuits 120 remain in the "high-performance" mode for a predetermined period of time, allowing each sensor circuit 120 to characterize the circuit branch 102 that it is measuring. In one embodiment, the predetermined period of time is several hours. In another embodiment, the predetermined period of time is several days. In other embodiments, the predetermined period of time may be defined as any length of time.

Various embodiments according to the present invention may be implemented on one or more computer systems or other devices. A computer system may be a single computer that may include a minicomputer, a mainframe, a server, a personal computer, or combination thereof. The computer system may include any type of system capable of performing remote computing operations (e.g., cell phone, PDA, tablet, smart-phone, set-top box, or other system). A computer system used to run the operation may also include any combination of computer system types that cooperate to accomplish system-level tasks. Multiple computer systems may also be used to run the operation. The computer system also may include input or output devices, displays, or data storage units. It should be appreciated that any computer system or systems may be used, and the invention is not limited to any number, type, or configuration of computer systems.

These computer systems may be, for example, general-purpose computers such as those based on Intel PENTIUM-type processor, Motorola PowerPC, Sun UltraSPARC, Hewlett-Packard PA-RISC processors, or any other type of processor. It should be appreciated that one or more of any type computer system may be used to partially or fully automate operation of the described system according to various embodiments of the invention. Further, the system may be located on a single computer or may be distributed among a plurality of computers attached by a communications network.

Figure 3:
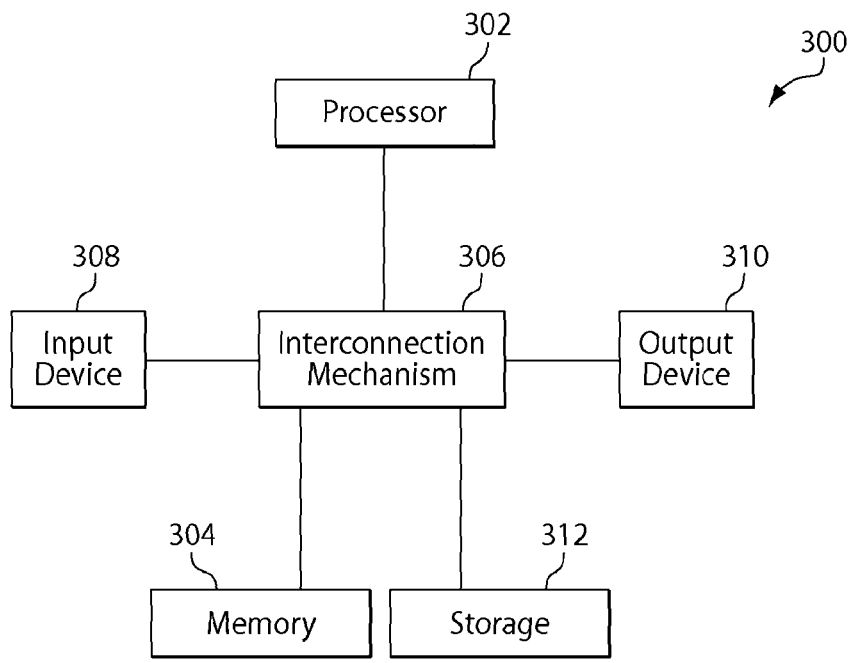
FIG. 3 is a block diagram of a general-purpose computer system upon which various embodiments of the invention may be implemented.

For example, various aspects of the invention may be implemented as specialized software executing in a general-purpose computer system 300 such as that shown in FIG. 3. The computer system 300 may include a processor 302 connected to one or more memory devices (i.e., data storage) 304, such as a disk drive, memory, or other device for storing data. Memory 304 is typically used for storing programs and data during operation of the computer system 300. Components of computer system 300 may be coupled by an interconnection mechanism 306, which may include one or more busses (e.g., between components that are integrated within a same machine) and/or a network (e.g., between components that reside on separate discrete machines). The interconnection mechanism 306 enables communications (e.g., data, instructions) to be exchanged between system components of system 300. Computer system 300 also includes one or more input devices 308, for example, a keyboard, mouse, trackball, microphone, touch screen, and one or more output devices 310, for example, a printing device, display screen, and/or speaker. In addition, computer system 300 may contain one or more interfaces (not shown) that connect computer system 300 to a communication network (in addition or as an alternative to the interconnection mechanism 306).

Figure 4:
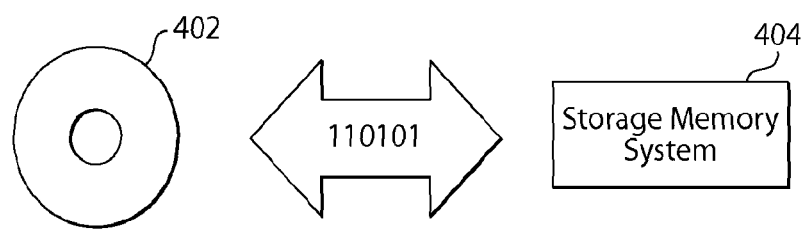
FIG. 4 is a block diagram of a computer data storage system with which various embodiments of the invention may be practiced.
Figure 4:
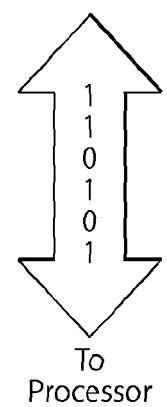

The storage system 312, shown in greater detail in FIG. 4, typically includes a computer readable and writeable nonvolatile recording medium 402 in which signals are stored that define a program to be executed by the processor or information stored on or in the medium 402 to be processed by the program. The medium may, for example, be a disk or flash memory. Typically, in operation, the processor causes data to be read from the nonvolatile recording medium 402 into another memory 404 that allows for faster access to the information by the processor than does the medium 402. This memory 404 is typically a volatile, random access memory such as a dynamic random access memory (DRAM) or static memory (SRAM). It may be located in storage system 312, as shown, or in memory system 304. The processor 302 generally manipulates the data within the integrated circuit memory 304, 404 and then copies the data to the medium 402 after processing is completed. A variety of mechanisms are known for managing data movement between the medium 402 and the integrated circuit memory element 304, 404, and the invention is not limited thereto. The invention is not limited to a particular memory system 304 or storage system 312.

The computer system may include specially-programmed, special-purpose hardware, for example, an application-specific integrated circuit (ASIC). Aspects of the invention may be implemented in software, hardware or firmware, or any combination thereof. Further, such methods, acts, systems, system elements and components thereof may be implemented as part of the computer system described above or as an independent component. Although computer system 300 is shown by way of example as one type of computer system upon which various aspects of the invention may be practiced, it should be appreciated that aspects of the invention are not limited to being implemented on the computer system as shown in FIG. 3. Various aspects of the invention may be practiced on one or more computers having a different architecture or components that that shown in FIG. 3.

Computer system 300 may be a general-purpose computer system that is programmable using a high-level computer programming language. Computer system 300 may be also implemented using specially programmed, special purpose hardware. In computer system 300, processor 302 is typically a commercially available processor such as the well-known Pentium class processor available from the Intel Corporation. Many other processors are available. Such a processor usually executes an operating system which may be, for example, the Windows XP, Windows Vista, Windows 7, or Windows 8 operating systems available from the Microsoft Corporation, MAC OS System X operating system or an iOS operating system available from Apple Computer, one of many Linux-based operating system distributions, for example, the Enterprise Linux operating system available from Red Hat Inc., or UNIX available from various sources. Many other operating systems may be used. The processor and operating system together define a computer platform for which application programs in high-level programming languages are written. It should be understood that the invention is not limited to a particular computer system platform, processor, operating system, or network.

Also, it should be apparent to those skilled in the art that the present invention is not limited to a specific programming language or computer system. Further, it should be appreciated that other appropriate programming languages and other appropriate computer systems could also be used.

One or more portions of the computer system may be distributed across one or more computer systems (not shown) coupled to a communications network. These computer systems also may be general-purpose computer systems. For example, various aspects of the invention may be distributed among one or more computer systems configured to provide a service (e.g., servers) to one or more client computers, or to perform an overall task as part of a distributed system. For example, various aspects of the invention may be performed on a client-server system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP).

It should be appreciated that the invention is not limited to executing on any particular system or group of systems. Also, it should be appreciated that the invention is not limited to any particular distributed architecture, network, or communication protocol. Various embodiments of the present invention may be programmed using an object-oriented programming language, such as Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof.

Embodiments described herein provide an accurate energy measurement system that minimizes the impact of measurement blind spots. According to at least one embodiment, the energy measurement system is a flexible and adaptable system where different circuit branches can be tailored with varying levels of "blindness" based on actual conditions or load characteristics. By keeping sensors in a sleep state until a change on the input line is detected that may impact power and energy measurement accuracy, and by only transmitting information updates when a change on a circuit branch is greater than a predetermined threshold, the required system resources of the system may be lowered while still maintaining relatively high power and/or energy measurements.

As described above, the energy measurement system may be utilized within a load center; however, in other embodiments, the energy measurement system described above may be utilized with any system including a distributed sensor network.

As also described above, the energy measurement system includes sensor circuits coupled to current transformers; however, in other embodiments, any other type of current sensor may be utilized to measure current in the branch circuits.

As also described above, the energy measurement system includes a communication bus which allows digital communication between the main controller and the sensor circuits/PVM; however, in other embodiments, the sensor circuits and/or PVM may be coupled directly to the main controller via an analog interface or a wireless/RF interface.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A system for monitoring a plurality of circuit branches coupled to at least one input line of a load center, the system comprising:
   a plurality of first current sensors, each configured to be coupled to one of the plurality of circuit branches and to produce a first reference signal having a level related to a current level of the one of the plurality of circuit branches;
   at least one second current sensor configured to be coupled to the at least one input line and to produce a second reference signal having a level related to a current level of the at least one input line;
   a controller;

a plurality of first sensor circuits, each coupled to an associated one of the plurality of first current sensors and configured to be coupled to the controller, wherein each one of the plurality of first sensor circuits is further configured, in a first mode of operation, to sample the first reference signal from the associated one of the plurality of first current sensors, and in a second mode of operation, to be powered off; and at least one second sensor circuit coupled to the at least one second current sensor and configured to be coupled to the controller, wherein the at least one second sensor circuit is further configured to sample the second reference signal from the at least one second current sensor and provide, based on the sampling, an input line current measurement signal to the controller, wherein the controller is configured to operate each one of the plurality of first sensor circuits in one of the first mode of operation and the second mode of operation based on the input line current measurement signal received from the at least one second sensor circuit.

2. The system of claim 1, wherein the controller is further configured to control the plurality of first sensor circuits to enter the second mode of operation in response to the input line current measurement signal received from the at least one second sensor circuit changing by less than a predetermined input line current threshold.

3. The system of claim 2, wherein the controller is further configured to control at least one of the plurality of first sensor circuits to enter the first mode of operation in response to the input line current measurement signal received from the at least one second sensor circuit changing by more than the predetermined input line current threshold.

4. The system of claim 1, wherein each one of the plurality of first sensor circuits is further configured, upon entering the first mode of operation, to compare a most recent sample of the first reference signal from its associated one of the plurality of first current sensors with a previously stored sample of the first reference signal.

5. The system of claim 4, wherein each one of the plurality of first sensor circuits is further configured, in the first mode of operation, to transmit a circuit branch current update signal to the controller, based on the most recent sample of the first reference signal, in response to a determination that the most recent sample of the first reference signal is different than the previously stored sample of the first reference signal by more than a predetermined circuit branch current threshold.

6. The system of claim 5, wherein each one of the plurality of first sensor circuits is further configured to enter the second mode of operation in response to a determination that the most recent sample of the first reference signal is different than the previously stored sample of the first reference signal by less than the predetermined circuit branch current threshold.

7. The system of claim 5, further comprising a communication bus, wherein each one of the plurality of first sensor circuits is further configured to be coupled to the controller via the communication bus, to convert the most recent sample of the first reference signal into a circuit branch digital reference signal, to generate the circuit branch current update signal based on the circuit branch digital reference signal, and to transmit the circuit branch current update signal to the controller, via the communication bus.

8. The system of claim 7, wherein each one of the plurality of second sensor circuits is further configured to be coupled to the controller via the communication bus, to convert samples of the second reference signal into input line digital reference signals, to generate input line current measurement signals based on the input line digital reference signals, and to transmit the input line current measurement signals to the controller via the communication bus.

9. The system of claim 1, further comprising a voltage module configured to be coupled to the at least one input line and the controller, wherein the voltage module is further configured to receive power from the at least one input line, to measure at least one of the voltage, phase, and frequency of the received power, and to transmit information related to the at least one of the measured voltage, phase, and frequency to the controller.

10. The system of claim 9, wherein the controller is further configured to transmit the information related to at least one of the measured voltage, phase, and frequency of the received power to at least one of the plurality of first sensor circuits, and wherein the at least one of the plurality of first sensor circuits is further configured to calculate a power parameter of the one of the plurality of circuit branches based on the sampled first reference signal and the received information related to at least one of the measured voltage, phase, frequency.

11. The system of claim 10, wherein the controller is further configured to transmit the information related to at least one of the measured voltage, phase, and frequency of the received power to the at least one of the plurality of first sensor circuits in response to a determination that the information related to at least one of the measured voltage, phase, and frequency received from the voltage module has changed by more than a predefined threshold.

12. The system of claim 11, wherein the controller is further configured to transmit the information related to at least one of the measured voltage, phase, and frequency of the received power to the at least one of the plurality of first sensor circuits in response to a determination that at least one of the voltage and frequency of the received power has changed by more than the predefined threshold.

13. A method for monitoring a plurality of circuit branches coupled to at least one input line of a load center, the method comprising:

coupling a first current sensor to each one of the plurality of circuit branches;

coupling at least one second current sensor to the at least one input line;

coupling a plurality of first sensor circuits to a controller, wherein each of the first sensor circuits is coupled to one of the first current sensors;

coupling at least one second sensor circuit to the controller, wherein the at least one second sensor circuit is coupled to the at least one second current sensor;

generating, in each first current sensor, a first reference signal having a level related to a current level of one of the plurality of circuit branches;

generating, in the at least one second current sensor, a second reference signal having a level related to a current level of the at least one input line;

sampling, with each one of the plurality of first sensor circuits in a first mode of operation, the first reference signal from the associated first current sensor;

maintaining, in a second mode of operation of the plurality of first sensor circuits, each one of the plurality of first sensor circuits in an off state; and controlling each one of the plurality of first sensor circuits to operate in one of the first mode of operation and the second mode of operation based on the second reference signal.

14. The method of claim 13, further comprising:
sampling, with the at least one second sensor circuit, the second reference signal from the at least one second current sensor;
providing, based on the sampling of the second reference signal, an input line current measurement signal from the at least one sensor circuit to the controller; and
controlling each one of the plurality of first sensor circuits to operate in one of the first mode of operation and the second mode operation based on the input line current measurement signal from the at least one second sensor circuit.

15. The method of claim 14, further comprising:
determining, based on the input line current measurement signal, whether the current level of the at least one input line has changed by more than a predetermined input line current threshold;
wherein controlling each one of the plurality of first sensor circuits to operate in one of the first mode of operation and the second mode of operation includes controlling each one of the plurality of first sensor circuits to enter the second mode of operation in response to a determination that the current level of the at least one input line has changed by less than a predetermined input line current threshold, and
wherein controlling each one of the plurality of first sensor circuits to operate in one of the first mode of operation and the second mode of operation further includes controlling at least one of the plurality of first sensor circuits to enter the first mode of operation in response to a determination that the current level of the at least one input line has changed by more than a predetermined input line current threshold.

16. The method of claim 15, further comprising
comparing, with each one of the plurality of first sensor circuits upon entering the first mode of operation, a most recent sample of the first reference signal from its associated first current sensor with a previously stored sample of the first reference signal;
transmitting, with each one of the plurality of first sensor circuits, a circuit branch current update signal to the controller, based on the most recent sample of the first reference signal, in response to the most recent sample of the first reference signal being different than the previously stored sample of the first reference signal by more than a predetermined circuit branch current threshold; and
controlling each one of the plurality of first sensor circuits to enter the second mode of operation in response to the most recent sample of the first reference signal being different than the previously stored sample of the first reference signal by less than the predetermined circuit branch current threshold.

17. The method of claim 16, further comprising, updating, with each one of the plurality of first sensor circuits upon transitioning from the first mode of operation to the second mode of operation, a value of the previously stored sample of the first reference signal to a value of the most recent sample of the first reference signal.

18. The method of claim 13, wherein sampling, with each one of the plurality of first sensor circuits in the first mode of operation, the first reference signal from the associated first current sensor includes sampling the first reference signal at least one of a predefined sample rate and for a predetermined period of time, and wherein the method further comprises adjusting at least one of the predefined sample rate and the predetermined period of time in response to a stability determination of the current level of an associated circuit branch.

19. The method of claim 13, further comprising:
measuring at least one of voltage, phase and frequency of power provided to the plurality of circuit branches;
determining if data related to at least one of the measured voltage, phase and frequency has changed by more than an input power threshold;
in response to a determination that the data related to at least one of the measured voltage, phase and frequency has changed by more than an input power threshold, transmitting the data related to the at least one of the voltage, the phase and the frequency to the plurality of first sensor circuits; and
calculating, with at least one of the plurality of first sensor circuits, a power parameter of one of the plurality of circuit branches based on the received data related to the at least one of the voltage, the phase and the frequency.

20. A system for monitoring a plurality of circuit branches coupled to at least one input line of a load center, the system comprising:
a plurality of current sensors, each configured to be coupled to at least one of the plurality of circuit branches and to produce a signal having a level related to a current level of the one of the plurality of circuit branches;
a controller;
a plurality of sensor circuits, each coupled to an associated one of the plurality of current sensors and configured to be coupled to the controller, wherein each one of the plurality of sensor circuits is configured to convert the signal from the associated one of the plurality of current sensors to a reference signal and provide the reference signal to the controller; and
means for monitoring a current level of the at least one input line and maintaining the plurality of sensor circuits in a sleep state until a change in the current level of the at least one input line is sensed that may impact power and energy measurement accuracy of the plurality of sensor circuits.

* * * * *